(12) United States Patent
Chang et al.

(10) Patent No.: US 10,850,976 B2
(45) Date of Patent: Dec. 1, 2020

(54) METHOD OF MAKING OHMIC CONTACT ON LOW DOPED BULK SILICON FOR OPTICAL ALIGNMENT

(71) Applicant: Taiwan Semiconductor Manufacturing Co., Ltd., Hsin-Chu (TW)

(72) Inventors: Kuei-Sung Chang, Koahsiung (TW); Chia-Hua Chu, Zhubei (TW); Shang-Ying Tsai, Pingzhen (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/515,325

(22) Filed: Jul. 18, 2019

(65) Prior Publication Data

US 2020/0095119 A1   Mar. 26, 2020

Related U.S. Application Data

(60) Provisional application No. 62/734,533, filed on Sep. 21, 2018.

(51) Int. Cl.
   *B81C 1/00*   (2006.01)
   *B81B 7/00*   (2006.01)
(52) U.S. Cl.
   CPC ........ *B81C 1/00166* (2013.01); *B81B 7/0006* (2013.01); *B81B 2203/0315* (2013.01);
   (Continued)

(58) Field of Classification Search
   CPC ........ B81C 1/00166; B81C 2201/0173; B81C 2201/019; B81C 3/004; B81C 1/00095;
   (Continued)

(56) References Cited

U.S. PATENT DOCUMENTS

| 5,511,428 A * | 4/1996 | Goldberg | B81B 7/0061 257/417 |
| 2003/0207487 A1 * | 11/2003 | Kubena | B81C 1/0015 438/52 |

(Continued)

OTHER PUBLICATIONS

Zeghbroeck, Bart Van. "Principles of Semiconductor Devices Chapter 3: Metal-Semiconductor Junctions." Published in 2000. Retrieved online on Aug. 22, 2019 from http://ecee.colorado.edu/~bart/ecen3320/newbook/chapter3/ch3_2.htm#fig3_2_1.

(Continued)

*Primary Examiner* — Victor A Mandala
(74) *Attorney, Agent, or Firm* — Eschweiler & Potashnik, LLC

(57) ABSTRACT

Various embodiments of the present disclosure are directed towards a method for forming an integrated chip including an epitaxial layer overlying a microelectromechanical systems (MEMS) substrate. The method includes bonding a MEMS substrate to a carrier substrate, the MEMS substrate includes monocrystalline silicon. An epitaxial layer is formed over the MEMS substrate, the epitaxial layer has a higher doping concentration than the MEMS substrate. A plurality of contacts are formed over the epitaxial layer, the plurality of contacts respectively form ohmic contacts with the epitaxial layer.

20 Claims, 10 Drawing Sheets

(52) U.S. Cl.
CPC ..... *B81B 2203/04* (2013.01); *B81B 2207/012* (2013.01); *B81B 2207/015* (2013.01); *B81B 2207/098* (2013.01); *B81C 2201/0173* (2013.01)

(58) Field of Classification Search
CPC ............ B81C 1/00198; B81C 1/00222; B81C 1/00238; B81C 1/00301; B81B 7/0006; B81B 2207/098; B81B 2203/0315; B81B 2207/015; B81B 2207/012; B81B 2203/04; B81B 5/00; B81B 7/007; B81B 7/02

See application file for complete search history.

(56) References Cited

U.S. PATENT DOCUMENTS

| | | | | |
|---|---|---|---|---|
| 2004/0253760 | A1* | 12/2004 | Zhang | B81C 1/00666 438/53 |
| 2006/0141786 | A1* | 6/2006 | Boezen | G01P 15/0802 438/689 |
| 2006/0175303 | A1* | 8/2006 | Sparks | B81B 1/00 219/121.43 |
| 2007/0269959 | A1* | 11/2007 | Freeman | B81C 3/002 438/455 |
| 2009/0261430 | A1* | 10/2009 | Suzuki | B81B 7/007 257/417 |
| 2014/0038392 | A1* | 2/2014 | Yonehara | B81C 1/0038 438/463 |
| 2014/0091405 | A1* | 4/2014 | Weber | G01L 9/0073 257/415 |
| 2014/0239423 | A1* | 8/2014 | Liu | B81B 7/007 257/417 |
| 2017/0129772 | A1 | 5/2017 | Cheng et al. | |
| 2017/0210619 | A1 | 7/2017 | Chang et al. | |
| 2019/0058085 | A1* | 2/2019 | Ahmed | H01L 33/24 |

OTHER PUBLICATIONS

Xiang, Ruifei. "Formation of Heat Resistant Ni Silicide Using Metal Additive for Nanoscale CMOS." Iwai Laboratory, Department of Advanced Applied Electronics, Tokyo Institute of Technology, published Mar. 2006.

Gui, Xiao. "Silicidation—Refractory Metal Silicide." Published on Sep. 22, 2015. Retrieved and machine translated online on Aug. 22, 2019 from http://ic-garden.cn/?p=829.

\* cited by examiner

METHOD OF MAKING OHMIC CONTACT ON LOW DOPED BULK SILICON FOR OPTICAL ALIGNMENT

REFERENCE TO RELATED APPLICATION

This Application claims the benefit of U.S. Provisional Application No. 62/734,533, filed on Sep. 21, 2018, the contents of which are hereby incorporated by reference in their entirety.

BACKGROUND

Microelectromechanical systems (MEMS) devices, such as accelerometers, pressure sensors, and microphones, have found widespread use in many modern day electronic devices. For example, MEMS accelerometers are commonly found in automobiles (e.g., in airbag deployment systems), tablet computers, or in smart phones. For many applications, MEMS devices are electrically connected to microcontrollers, microprocessors, or application-specific integrated circuits (ASICs) to form complete MEMS systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
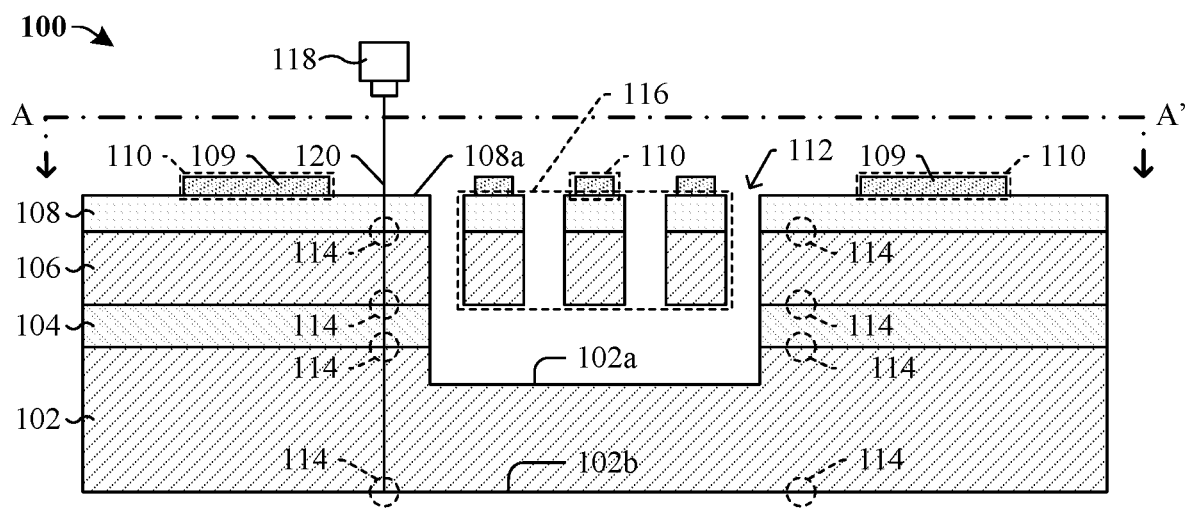
FIG. 1A illustrates a cross-sectional view of some embodiments of a microelectromechanical systems (MEMS) structure including a plurality of ohmic contacts over a low doped bulk silicon substrate.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During formation of a microelectromechanical systems (MEMS) device, a MEMS substrate may be bonded to a first side of a carrier substrate through a fusion bond dielectric layer. The first side of the carrier substrate includes a cavity and a plurality of alignment regions. After bonding, conductive contacts are formed over the MEMS substrate and then an etching process is performed on the MEMS substrate to define a moveable element over the cavity.

During operation of the MEMS device, the moveable element of the MEMS substrate is configured to move in response to external stimuli. For example, in a MEMS microphone the moveable element may oscillate in response to incident sound waves. To measure movement of the moveable element, the conductive contacts may electrically couple the MEMS substrate to another substrate having logic devices configured to process an output of the MEMS substrate. However, the MEMS substrate may sometimes be comprised of low-doped silicon. Since the MEMs substrate is comprised of low-doped silicon, it is difficult to get a good electrical contact (e.g., an Ohmic contact) between the MEMS substrate and the conductive contacts. Therefore, to enable the formation of conductive contacts on the MEMS substrate, a doping process may be performed to highly dope the MEMS substrate (e.g., highly doped includes a doping concentration greater than $1*10^{17}$ atoms/cm$^3$ or greater than $1*10^{18}$ atoms/cm$^3$) prior to the formation of the conductive contacts.

To enable proper alignment of the conductive contacts according to the alignment regions, near IR light is used to "see through" the MEMS substrate during the bonding process. However, the doping process reduces an ability of near IR radiation to penetrate through the MEMS substrate and thus can cause difficulty in the doping process and/or the alignment process. These challenges may result in a non-ohmic contact and/or misalignment between the plurality of conductive contacts and the MEMS substrate, such that the current and voltage characteristics between the two are not linear.

For example, the alignment process typically involves utilizing an infrared (IR) sensor with a wavelength between approximately 780 nanometers to approximately 2500 nanometers. The aforementioned IR sensor has challenges penetrating highly doped silicon with a thickness greater than 50 micrometers because of increased absorption from free carriers within the highly doped silicon. The IR sensor is unable to penetrate the highly doped MEMS substrate in such a manner to accurately complete the alignment process by virtue of the plurality of alignment regions within the carrier substrate. Therefore, the plurality of conductive contacts are not properly aligned above the plurality of alignment regions resulting in a non-ohmic contact and/or misalignment between the plurality of conductive contacts and the MEMS substrate.

In some embodiments of the present disclosure, an improved method for manufacturing a MEMS device is disclosed. The method utilizes a highly doped epitaxial layer over the MEMS substrate in place of doping the MEMS substrate to provide electrical coupling between the plurality of conductive contacts and the MEMS substrate. The highly doped epitaxial layer is thin (e.g., less than 5 micrometer) in comparison to the MEMS substrate (e.g., the MEMS substrate is at least 5 times thicker than the highly doped epitaxial layer). Therefore, an IR sensor is able to penetrate the highly doped epitaxial layer and MEMS substrate to detect the plurality of alignment regions. This improved process ensures proper alignment between the MEMS substrate and the carrier substrate and provides ohmic contacts between the plurality of conductive contacts and the MEMS substrate.

According to some embodiments of the improved method, a MEMS substrate is formed over a first side of a carrier substrate. The first side of the carrier substrate includes a cavity and a plurality of alignment regions. The MEMS substrate is comprised of lightly doped (e.g., a doping concentration less than $1*10^{17}$ atoms/cm$^3$) silicon with a thickness less than approximately 775 micrometers. A thin (e.g., less than 1 micrometer thick) layer of semiconductor material (e.g., an epitaxial layer, a polysilicon layer, an amorphous silicon layer, or the like) is formed over the MEMS substrate. The layer of semiconductor material has a greater doping concentration (e.g., a doping concentration greater than $1*10^{18}$ atoms/cm$^3$) than the MEMS substrate. A plurality of conductive contacts are formed over the layer of semiconductor material. An IR sensor is used to align the plurality of contacts by virtue of the plurality of alignment regions. An etching process is performed to remove a portion of the MEMS substrate and the layer of semiconductor material directly above the cavity defining a movable element. The thin and highly doped epitaxial layer ensures an ohmic contact may be formed over the MEMS substrate while concurrently facilitating use of the IR sensor for accurate alignment of the plurality of conductive contacts and/or any subsequent layer(s) formed over the layer of semiconductor material.

Figure 1B:
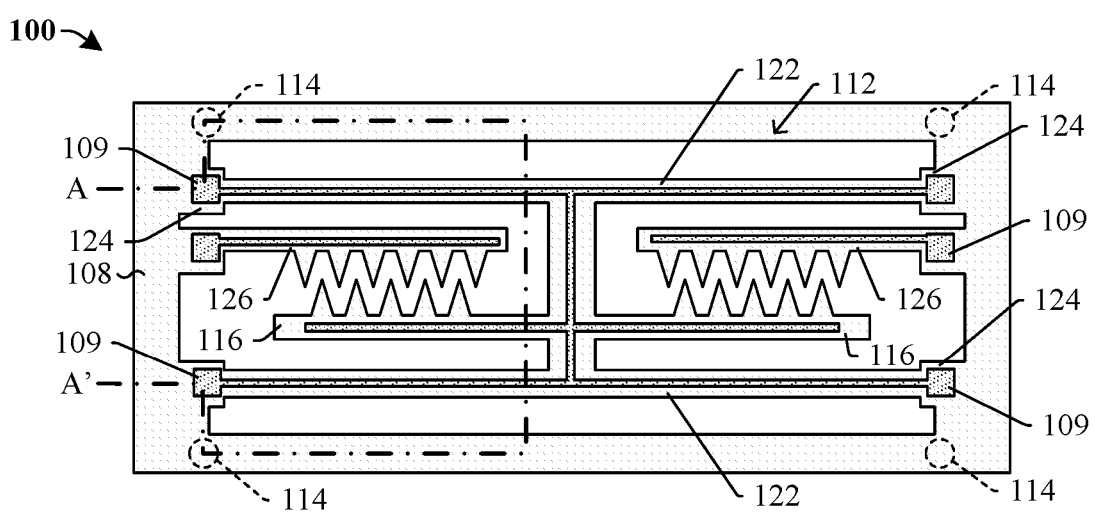
FIG. 1B illustrates some embodiments of a top view of the MEMS structure of FIG. 1A, as indicated by the line A-A'

Referring to FIG. 1A, a cross-sectional view of a MEMS structure 100 in accordance with some embodiments is provided. FIG. 1B illustrates some embodiments of a top view of the MEMS structure 100 taken along line A-A' of FIG. 1A.

As illustrated in FIG. 1A, the MEMS structure 100 includes a dielectric layer 104 between a MEMS substrate 106 and a carrier substrate 102. An epitaxial layer 108 overlies the MEMS substrate 106. In some embodiments, the epitaxial layer 108 may, for example, be or comprise polysilicon, silicon, amorphous silicon, or the like. In some embodiments, the MEMS substrate 106 may, for example, be or comprise a bulk silicon substrate, monocrystalline silicon, or the like. A plurality of contacts 110 overlie the epitaxial layer 108. In some embodiments, the plurality of contacts 110 include a metal layer 109. In some embodiments, the metal layer 109 may, for example, be or comprise aluminum, copper, aluminum copper, or the like. The epitaxial layer 108 is highly doped (e.g., a doping concentration greater than $1*10^{18}$ atoms/cm$^3$), such that each contact in the plurality of contacts 110 respectively form an ohmic contact with the epitaxial layer 108. The ohmic contact ensures a substantially linear current and voltage while applying a bias to any contact in the plurality of contacts 110 during operation of the MEMS structure 100. In further embodiments, the epitaxial layer 108 is omitted and the metal layer 109 may be replaced with a highly doped (e.g., a doping concentration greater than $1*10^{18}$ atoms/cm$^3$) polysilicon layer, such that the highly doped polysilicon layer directly contacts the MEMS substrate 106. A cavity 112 is defined between a top surface 108a of the epitaxial layer 108 and an upper surface 102a of the carrier substrate 102. One or more moveable elements 116 are within the cavity 112. A plurality of alignment marks 114 are disposed on or within a surface of the carrier substrate 102, the dielectric layer 104, the MEMS substrate 106, and/or the epitaxial layer 108.

During formation of the MEMS structure 100, an infrared (IR) sensor 118 is utilized to ensure the plurality of contacts 110 are properly aligned over the MEMS substrate 106 by virtue of the plurality of alignment marks 114. The IR sensor 118 illuminates an IR light 120 (e.g., the IR light 120 is within a range of approximately 780 to approximately 2500 nanometers) from the top surface 108a of the epitaxial layer 108 to a bottom surface 102b of the carrier substrate 102. The IR sensor 118 checks that a photomask used to form the plurality of contacts 110 is aligned with the plurality of alignment marks 114. Using the IR sensor 118 to align the plurality of contacts 110 allows the plurality of contacts 110 to be accurately formed over the MEMS substrate 106 according to the plurality of alignment marks 114. The accurate formation promotes proper electrical coupling (e.g., an ohmic contact at a predefined location) between the plurality of contacts 110 and the epitaxial layer 108.

In some embodiments, the MEMS substrate 106 comprises a low doping concentration (e.g., a doping concentration less than $1*10^{17}$ atoms/cm$^3$) that, in turn, mitigates reflection (or absorption) of the IR light 120. In some embodiments, the carrier substrate 102 comprises the low doping concentration (e.g., a doping concentration less than $1*10^{17}$ atoms/cm$^3$) to facilitate illumination of the IR light 120 through a thickness of the carrier substrate 102. In some embodiments, the carrier substrate 102, the dielectric layer 104, the MEMS substrate 106, and the epitaxial layer 108 are respectively formed in such a manner that a near IR (NIR) wavelength of between approximately 780 nanometers to approximately 2500 nanometers can continuously illuminate from the top surface 108a of the epitaxial layer 108 to the bottom surface 102b of the carrier substrate 102.

With reference to FIG. 1B, some embodiments of a top view of the MEMS structure 100 taken along line A-A' of FIG. 1A is provided. In some embodiments, FIG. 1A illustrates some embodiments of a cross-sectional view taken along line A-A' of the top view of FIG. 1B. The carrier substrate (102 of FIG. 1A) has been omitted from the top view of FIG. 1B for ease of illustration.

The one or more moveable elements 116 (e.g., a proof mass) are attached to the MEMS substrate (106 of FIG. 1A) and the epitaxial layer 108 at anchor structures 124 by way of tethers 122. The tethers 122 are configured to suspend the one or more movable elements 116 in the cavity 112. The metal layer 109 is configured to continuously extend across the anchor structures 124 and the tethers 122 to the one or more movable elements 116. In some embodiments, the plurality of alignment marks 114 may be disposed laterally offset from the anchor structures 124. Further, static structures 126 may extend in the cavity 112 and be disposed laterally adjacent to the one or more movable elements 116. In further embodiments, the MEMS structure 100 may be configured as, for example, an electrostatic actuator (e.g., see FIG. 4A).

Figure 2:
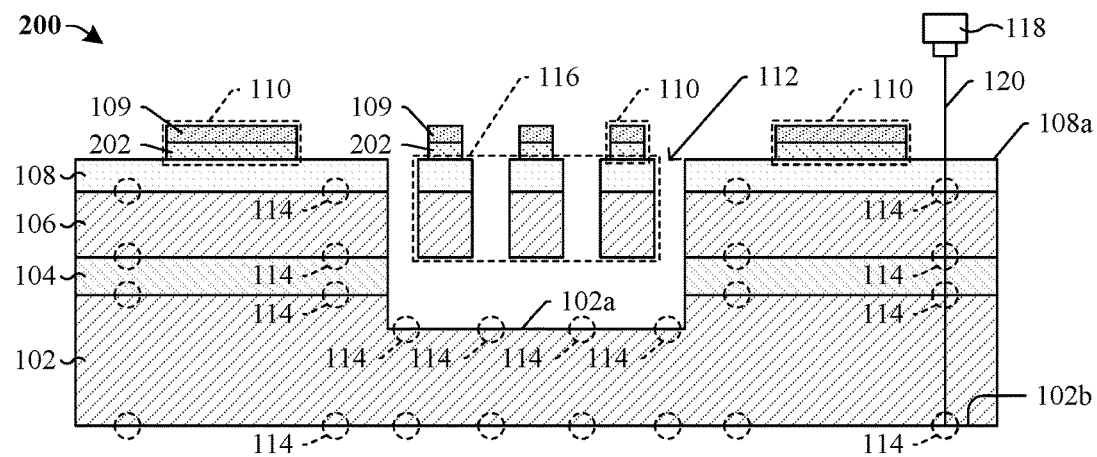
FIG. 2 illustrates a cross-sectional view of some alternative embodiments of the MEMS structure of FIG. 1A in which the plurality of ohmic contacts include a metal layer and silicide layer.

With reference to FIG. 2, a cross-sectional view of a MEMS structure 200 according to some alternative embodiments of the MEMS structure 100 of FIG. 1A is provided in which the plurality of contacts 110 respectively comprise a metal layer 109 and a silicide layer 202.

The MEMS structure 200 includes a plurality of contacts 110 overlying the epitaxial layer 108. The plurality of contacts 110 respectively comprise the metal layer 109 overlying the silicide layer 202. In some embodiments, the metal layer 109 may, for example, be or comprise aluminum, copper, aluminum copper, or the like, having a thickness within a range of approximately 100 to 1000 nanometers. In some embodiments, the silicide layer 202, may for example be or comprise titanium silicon ($TiSi_2$), copper silicon (CoSi, $Co_2Si$, or $CoSi_2$), nickel silicon (NiSi or $NiSi_2$), Palladium silicon ($Pd_2Si$), or the like, having a thickness within a range of approximately 1 to 20 nanometers. The plurality of contacts 110 respectively form an ohmic contact with the epitaxial layer 108. In some embodiments, the silicide layer 202 comprises silicon and a metal different than a metal of the metal layer 109. For example, the silicide layer 202 may comprise titanium silicon or nickel silicon and the metal layer 109 may comprise aluminum and/or copper. In some embodiments, a bottom surface of the silicide layer 202 extends below a top surface 108a of the epitaxial layer 108 (not shown). In some embodiments, a maximum width of the plurality of contacts 110 directly over the cavity 112 are at least half a minimum width of the plurality of contacts 110 laterally offset from the cavity 112.

The plurality of alignment marks 114 are disposed on or within a top surface and/or a bottom surface of the carrier substrate 102, the dielectric layer 104, the MEMS substrate 106, and/or the epitaxial layer 108. The plurality of alignment marks 114 may be placed on any layer in any location, therefore the placement of the alignment marks 114 on the MEMS structure 200 in FIG. 2 is merely a non-limiting example. A first subset of the plurality of alignment marks 114 are placed on an upper surface 102a of the carrier substrate 102 within the cavity 112. The first subset of the plurality of alignment marks 114 may be used to accurately align the plurality of contacts 110 over the plurality of moveable elements 116.

In some embodiments, the carrier substrate 102 may, for example, be or comprise a bulk substrate (e.g., a bulk silicon substrate), monocrystalline silicon, P doped silicon, N doped silicon, or the like, having a thickness within a range of approximately 550 to 750 micrometers. In some embodiments, the carrier substrate 102 may, for example, have a doping concentration less than approximately $1*10^{17}$ atoms/$cm^3$. In some embodiments, the dielectric layer 104 may, for example, be or comprise silicon oxide, silicon nitride, silicon carbide, some other oxide, or the like, having a thickness within a range of approximately 0.1 to 30 micrometers. In some embodiments, the dielectric layer 104 may be omitted and another suitable bonding method may be performed to bond the carrier substrate 102 to the MEMS substrate 106.

In some embodiments, the MEMS substrate 106 may, for example, be or comprise a bulk substrate (e.g., a bulk silicon substrate), monocrystalline silicon, P doped silicon, N doped silicon, or the like, having a thickness within a range of approximately 5 to 775 micrometers. In some embodiments, the MEMS substrate 106 and/or the carrier substrate 102 may be, for example, intrinsic silicon or intrinsic monocrystalline silicon. The carrier substrate 102 and/or MEMS substrate 106 comprising intrinsic silicon facilitates the illumination of a NIR light through an entire thickness of both substrates because both substrates have few or no free carriers present. Therefore, intrinsic silicon or intrinsic monocrystalline silicon strongly facilitates propagation of NIR light, and thus detection of alignment marks on a surface of a substrate. In some embodiments, if the thickness of the MEMS substrate 106 is less than approximately 5 micrometers, then the MEMS structure 200 may be lacking in structural integrity. In some embodiments, if the thickness of the MEMS substrate is greater than approximately 775 micrometers, then the IR light 120 may not illuminate through the MEMS substrate 106. In some embodiments, the MEMS substrate 106 may, for example, have a doping concentration less than approximately $1*10^{17}$ atoms/$cm^3$. In some embodiments, the carrier substrate 102 and the MEMS substrate 106 have a same doping concentration. In some embodiments, the MEMS substrate 106 has a resistance within a range of approximately 2 to 20 ohms centimeter (ohm-cm). In some embodiments, if the resistance of the MEMS substrate 106 is less than approximately 2 ohm-cm then the doping concentration may be too high and the IR light 120 may not illuminate through the MEMS substrate 106.

In some embodiments, the epitaxial layer 108 may, for example, be or comprise polysilicon, silicon, amorphous silicon, or the like having a thickness within a range of approximately 1 to 5000 nanometers. If the epitaxial layer 108 is too thin (e.g., less than approximately 1 nanometer), there are difficulties in creating an ohmic contact with metal layers disposed above and the layer becomes susceptible to delamination. If the epitaxial layer 108 is too thick (e.g., greater than approximately 5000 nanometers), the IR light 120 may be unable to penetrate the epitaxial layer 108 in turn, leading to misalignment of the plurality of contacts 110. In some embodiments, the epitaxial layer 108 comprises a doping concentration within a range of approximately $6*10^{17}$ to $1*10^{20}$ atoms/$cm^3$. In some embodiments, the epitaxial layer 108 has a resistance of less than approximately 2 milliohms centimeter (milliohm-cm). In some embodiments, the resistance of the epitaxial layer 108 is within a range of approximately 1 to 5 milliohm-cm. In some embodiments, if the resistance of the epitaxial layer 108 is greater than approximately 5 milliohm-cm, the plurality of contacts 110 may be unable to form an ohmic contact with the epitaxial layer 108.

Figure 3:
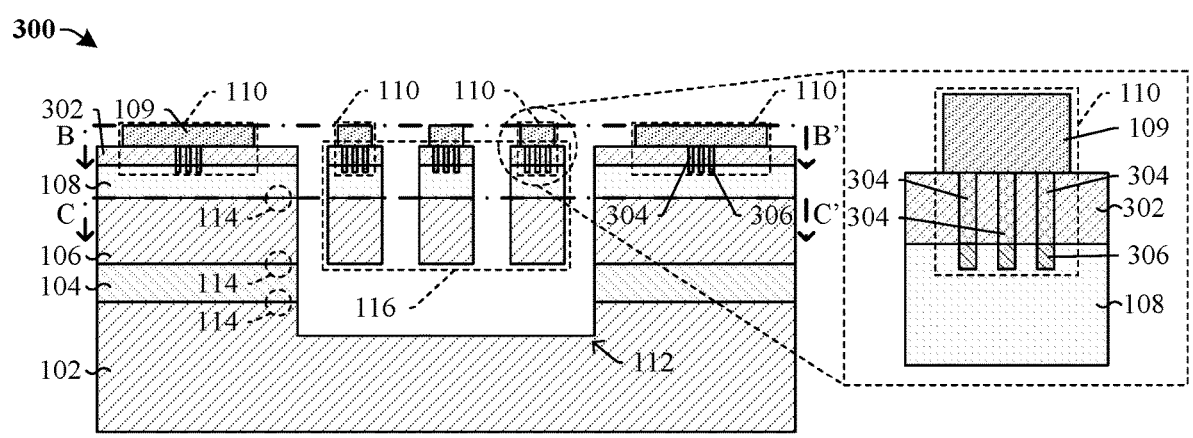
FIG. 3 illustrates a cross-sectional view of some alternative embodiments of the MEMS structure of FIG. 1A in which the plurality of ohmic contacts respectively include a metal layer and a plurality of vias.

With reference to FIG. 3, a cross-sectional view of a MEMS structure 300 according to some alternative embodiments of the MEMS structure 100 of FIG. 1A is provided in which the plurality of contacts 110 respectively comprise a metal layer 109 and a plurality of vias 304.

The MEMS structure 300 includes a passivation layer 302 overlying the epitaxial layer 108 and a plurality of contacts 110 overlying the passivation layer 302. In some embodiments, the passivation layer 302 is silicon oxide, silicon nitride, silicon carbide, some other oxide, or the like. The plurality of contacts 110 respectively comprise a metal layer 109 overlying a plurality of vias 304 and a plurality of silicide segments 306 under the plurality of vias 304. In some embodiments, the silicide segments 306 may laterally extend past outermost sidewalls of an overlying one of the plurality of vias 304, so that the silicide segments 306 have a larger width than the overlying one of the plurality of vias 304. The plurality of vias 304 extend from the metal layer 109 to a top surface of the epitaxial layer 108 through the passivation layer 302. The plurality of vias 304 form an ohmic contact with the epitaxial layer 108. In some embodiments, the plurality of vias 304 may, for example, be or comprise titanium, titanium nitride, tungsten, or the like. In some embodiments, the metal layer 109 may, for example, be or comprise aluminum, copper, aluminum copper, or the like. In some embodiments, the plurality of silicide segments 306 may, for example, be or comprise titanium silicon, tungsten silicon, or the like. In some embodiments, the metal layer 109 comprises a metal different than the plurality of vias 304. In some embodiments, the plurality of silicide segments 306 are omitted. In some embodiments, the metal layer 109 and the plurality of vias 304 are a single continuous material (not shown).

Figure 4A:
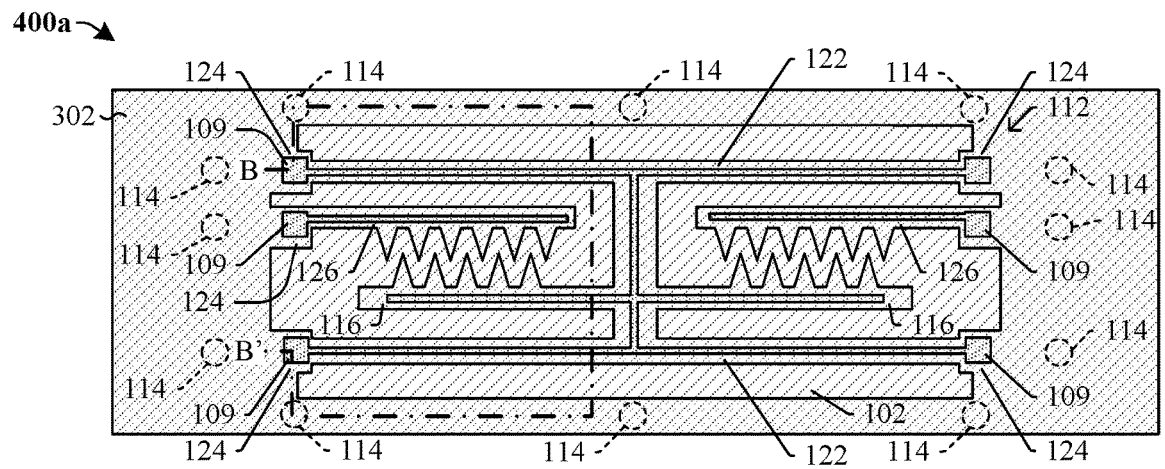
FIG. 4A illustrates some embodiments of a top view of the MEMS structure of FIG. 3, as indicated by the line B-B'.

With reference to FIG. 4A, some embodiments of a top view 400a of the MEMS structure 300 of FIG. 3, as indicated by the line B-B'.

As illustrated in the cross-sectional view of FIG. 3, the line B-B' is along a top surface of the metal layer 109. As seen in the top view 400a the plurality of alignment marks 114 are laterally offset from the metal layer 109 and the cavity 112. The plurality of alignment marks 114 on the top and bottom surface of the MEMS substrate (106 of FIG. 3) are laterally centered with respective midpoints of the plurality of alignment marks 114 on the top surface of the carrier substrate 102. In some embodiments, the plurality of alignment marks 114 on the top and bottom surface of the MEMS substrate (106 of FIG. 3) and the plurality of alignment marks 114 on the top surface of the carrier substrate 102 are respectively centered about a substantially straight vertical line. In some embodiments, the plurality of alignment marks 114 cannot be detected from a top surface of the passivation layer 302 without use of the IR sensor (118 of FIG. 1A).

In some embodiments, the MEMS structure 300 of FIG. 3 as illustrated in top view 400a is configured as an electrostatic actuator. In such embodiments, the one or more moveable elements 116 (e.g., a proof mass) are attached to the MEMS substrate (106 of FIG. 3) at anchor structures 124. The one or more moveable elements 116 may have one or more tethers 122 extending from the anchor structures 124 that are configured to suspend the one or more moveable elements 116 in the cavity 112. Thus, the one or more moveable elements 116 may freely move along an axis (e.g., an x-axis, a y-axis, and/or a z-axis). In further embodiments, the one or more tethers 122 are portions of the MEMS substrate (106 of FIG. 3) and/or are portions of the one or more moveable elements 116. Further, static structures 126 may extend in the cavity 112 and be disposed laterally adjacent to the one or more movable elements 116. The static structures 126 may be configured to not move in relation to the MEMS substrate (106 of FIG. 3). Furthermore, the static structures 126 and/or the one or more movable elements 116 may comprise one or more protrusions to prevent stiction between the aforementioned elements. In some embodiments, as the moveable elements 116 move in relation to the static structures 126, a change in capacitance may be detected between the metal layer 109 disposed over the static structures 126 and the metal layer 109 disposed over the one or more moveable elements 116. It may be appreciated that the MEMS structure 300 of FIG. 3 may be configured as any MEMS device, thus top view 400a is merely an example.

Figure 4B:
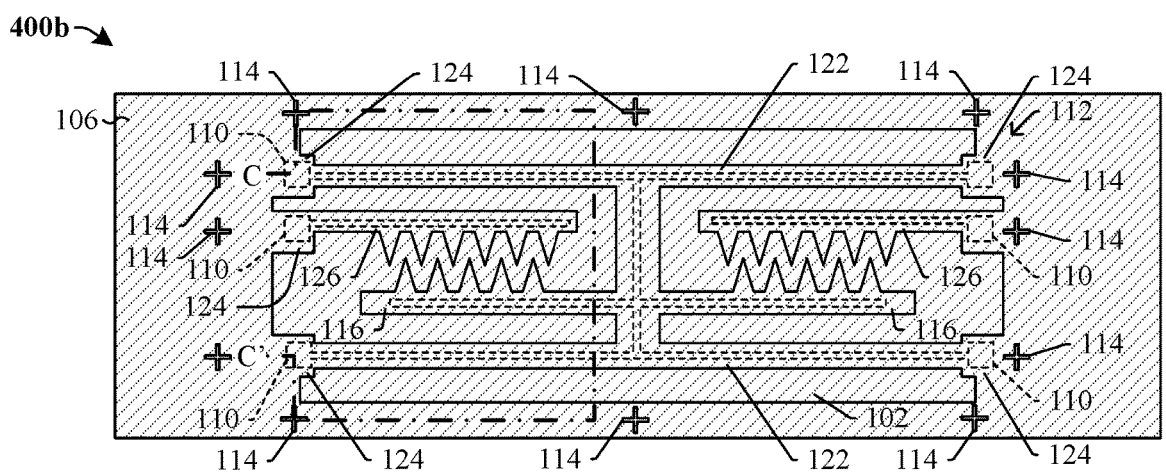
FIG. 4B illustrates some embodiments of a top view of the MEMS structure of FIG. 3, as indicated by the line C-C'.

With reference to FIG. 4B, some embodiments of a top view 400b of the MEMS structure 300 of FIG. 3, as indicated by the line C-C'.

As illustrated in the cross-sectional view of FIG. 3, the line C-C' is along the top surface of the MEMS substrate 106. As seen in the top view 400b, the plurality of alignment marks 114 may comprise lines extending in one or more directions. In some embodiments, the alignment marks 114 may comprise perpendicular lines. For example, the alignment marks 114 may comprise a cross shape. In other embodiments, the alignment marks 114 may comprise Moire patterns. In some embodiments, the alignment marks 114 may be defined by recesses (e.g., trenches) within a surface of the MEMS substrate 106 (e.g., having a depth of approximately 1 micrometer or more). In other embodiments, the alignment marks 114 may be defined by a conductive material patterned over the MEMS substrate 106. It can be appreciated that the plurality of alignment marks 114 can take on any shape, thus FIG. 4B is merely an example. The plurality of alignment marks 114 comprise the cross shape on a top surface and/or a bottom surface of the carrier substrate (102 of FIG. 3) and the MEMS substrate 106.

Figure 5:
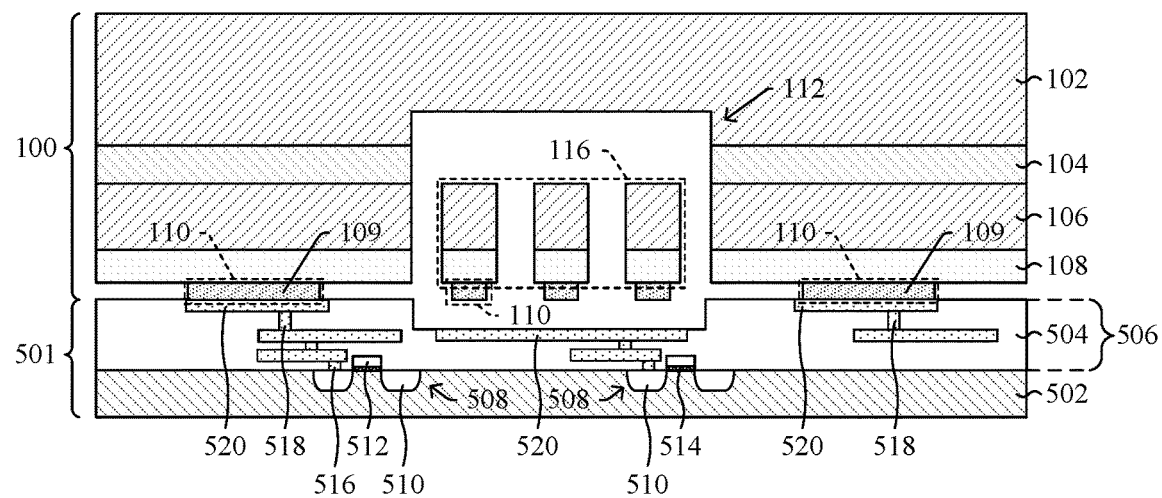
FIG. 5 illustrates a cross-sectional view of some embodiments of an integrated chip including the MEMS structure of FIG. 1A bonded to a complementary metal-oxide-semiconductor (CMOS) integrated circuit (IC) die.

With reference to FIG. 5, a cross-sectional view of an integrated chip 500 is provided in which the MEMS structure 100 of FIG. 1A is bonded to a complementary metal-oxide-semiconductor (CMOS) integrated circuit (IC) die 501.

The integrated chip 500 includes the MEMS structure 100 overlying the CMOS IC die 501. The plurality of contacts 110 are between the epitaxial layer 108 and an inter-layer dielectric (ILD) structure 504. A CMOS substrate 502 underlies the ILD structure 504. The CMOS substrate 502 and the ILD structure 504 include electronic components such as transistors 508, and/or other electronic components (not shown), such as, one or more capacitors, resistors, inductors, or diodes. The transistors 508 respectively comprise source/drain regions 510, a gate electrode 512, and a gate dielectric 514. The CMOS substrate 502 may, for example, be or comprise a bulk semiconductor substrate or a SOI substrate. A cavity 112 is located between the carrier substrate 102 and the ILD structure 504. A back-end-of-line (BEOL) metallization stack 506 is between the CMOS substrate 502 and the plurality of contacts 110. The BEOL metallization stack 506 includes the ILD structure 504, metal wires 520, metal vias 518, and metal contacts 516. The ILD structure 504 may comprise, for example, a plurality of stacked ILD layers respectively comprising a low κ dielectric (i.e., a dielectric with a dielectric constant less than about 3.9), an oxide, or the like. The metal wires 520, the metal vias 518, and the metal contacts 516 electrically couple electric components such as transistors 508 to the plurality of contacts 110. The metal wires 520, the metal vias 518, and the metal contacts 516 may be, for example, a conductive material, such as aluminum copper, germanium, copper, tungsten, or some other metal.

Figure 6:
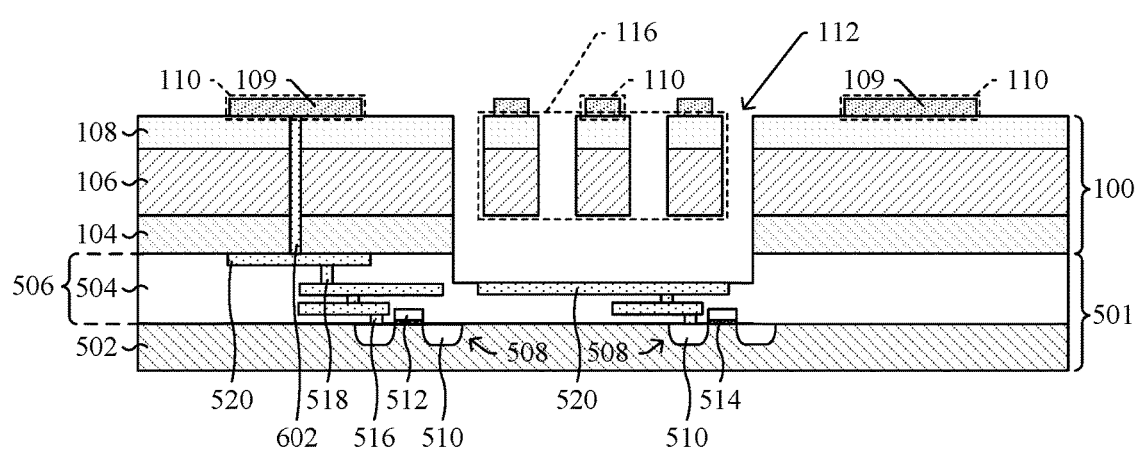
FIG. 6 illustrates a cross-sectional view of some alternative embodiments of the integrated chip of FIG. 5.

With reference to FIG. 6, a cross-sectional view of an integrated chip 600 according to some alternative embodiments of the integrated chip 500 of FIG. 5 is provided in which the carrier substrate (102 of FIG. 5) is omitted.

The integrated chip 600 includes the MEMS structure 100 such that the carrier substrate (102 of FIG. 5) is omitted. The dielectric layer 104 is between the MEMS substrate 106 and the ILD structure 504, and facilities bonding of the MEMS substrate 106 to the CMOS IC die 501, typically by a fusion bond. The cavity 112 is defined between a top surface of the epitaxial layer 108 and the ILD structure 504. A through silicon via (TSV) 602 extends from the metallization wire 520 to a contact in the plurality of contacts 110. The TSV 602 electrically couples the contact 110 to the BEOL metallization stack 506 and at least one transistor 508.

Figure 7:
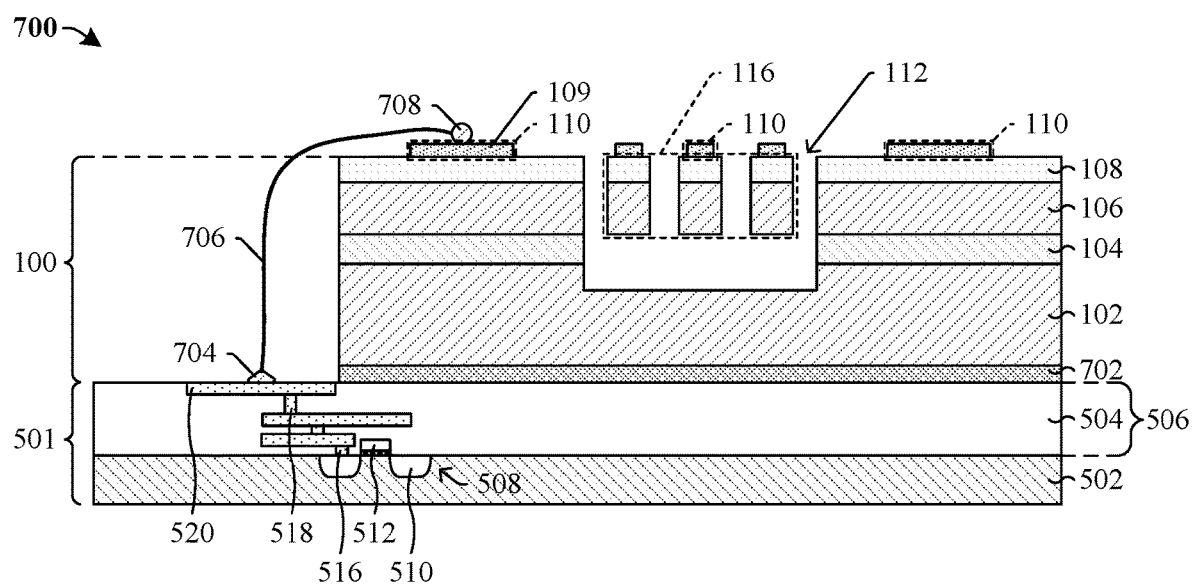
FIG. 7 illustrates a cross-sectional view of some alternative embodiments of the integrated chip of FIG. 5.

With reference to FIG. 7, a cross-sectional view of an integrated chip 700 according to some alternative embodiments of the integrated chip 500 of FIG. 5 is provided in which the MEMS structure 100 of FIG. 1A is bonded to a complementary metal-oxide-semiconductor (CMOS) integrated circuit (IC) die 501.

The integrated chip 700 includes the MEMS structure 100 bonded to the CMOS IC die 501 via a bottom dielectric layer 702. A connector pad 704 overlies a metallization wire 520 providing a wire bonding location for a metal wire 706. A solder ball 708 overlies a contact in the plurality of contacts 110. The solder ball 708 provides a contact point for the metal wire 706. The metal wire 706 directly contacts the connector pad 704 and the solder ball 708. In some embodiments, the metal wire 706 is electrically coupled to a different independent device (not shown).

FIGS. 8-14 illustrate cross-sectional views 800-1400 of some embodiments of a method of forming an integrated chip including a microelectromechanical systems (MEMS) structure with an epitaxial layer overlying a MEMS substrate according to the present disclosure. Although the cross-sectional views 800-1400 shown in FIGS. 8-14 are described with reference to a method, it will be appreciated that the structures shown in FIGS. 8-14 are not limited to the method but rather may stand alone separate of the method. Although FIGS. 8-14 are described as a series of acts, it will be appreciated that these acts are not limiting in that the order of the acts can be altered in other embodiments, and the methods disclosed are also applicable to other structures.

Figure 8:
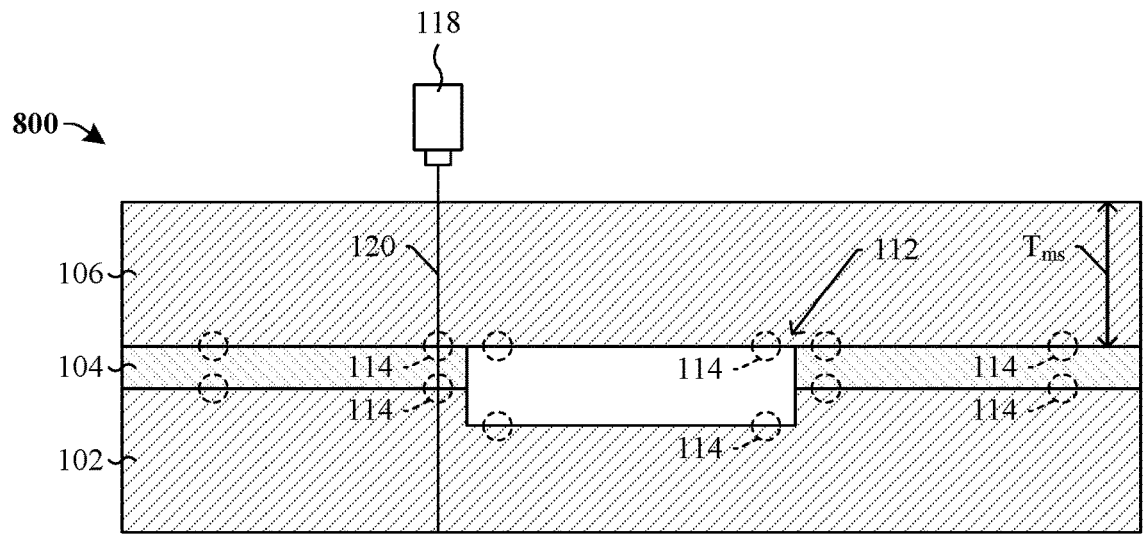
FIGS. 8-14 illustrate cross-sectional views of some embodiments of forming an integrated chip including a microelectromechanical systems (MEMS) structure including a plurality of ohmic contacts over a low doped bulk silicon substrate.

As shown in cross-sectional view 800 of FIG. 8, a carrier substrate 102 with a plurality of alignment marks 114 and a cavity 112 is provided. A MEMS substrate 106 is bonded to the carrier substrate 102 through a dielectric layer 104. Typically, the bond is formed by a fusion bonding, but other approaches to bonding are amenable. The cavity 112 is sealed by the bonding process. In some embodiments, the plurality of alignment marks 114 are formed on a bottom surface of the MEMS substrate 106 before performing the bonding process. In some embodiments, the plurality of alignment marks 114 are formed on a top side of the carrier substrate 102 and a bottom side of the carrier substrate 102 before the bonding process (not shown). In some embodiments, during the bonding processes an IR sensor 118 is utilized to align the MEMS substrate 106 over the carrier substrate 102 by virtue of the plurality of alignment marks 114. The IR sensor 118 illuminates an IR light 120 (e.g., the IR light 120 is within a range of 780 to 2500 nanometers) from a top surface of the MEMS substrate 106 to at least a top surface of the carrier substrate 102. As seen in FIG. 8, the IR sensor 118 verifies that a center of the plurality of alignment marks 114 on the bottom surface of the MEMS substrate 106 is aligned with a center of the plurality of alignments marks 114 on the top surface of the carrier substrate 102.

In some embodiments, the MEMS substrate 106 may, for example, be or comprise bulk substrate (e.g., a bulk silicon substrate), monocrystalline silicon, P doped silicon, N doped silicon, or the like formed to a thickness $T_{ms}$ within a range of approximately 675 to 775 micrometers. In some embodiments, the carrier substrate 102 may, for example, be or comprise bulk substrate (e.g., a bulk silicon substrate), monocrystalline silicon, P doped silicon, N doped silicon, or the like formed to a thickness within a range of approximately 675 to 775 micrometers. In some embodiments, the carrier substrate 102 and the MEMS substrate 106 comprise the same material with approximately the same doping type and concentration. In some embodiments, the dielectric layer 104 may, for example, be or comprise silicon oxide, silicon nitride, silicon carbide, some other oxide, or the like formed to a thickness within a range of approximately 25 to 75 micrometers. In some embodiments, the MEMS substrate 106 and the carrier substrate 102 may, for example, have a doping concentration within a range of approximately $1*10^{13}$ to $1*10^{16}$ atoms/cm$^3$. In some embodiments, the MEMS substrate 106 has a resistance within a range of approximately 2 to 20 ohm-cm.

Figure 9:
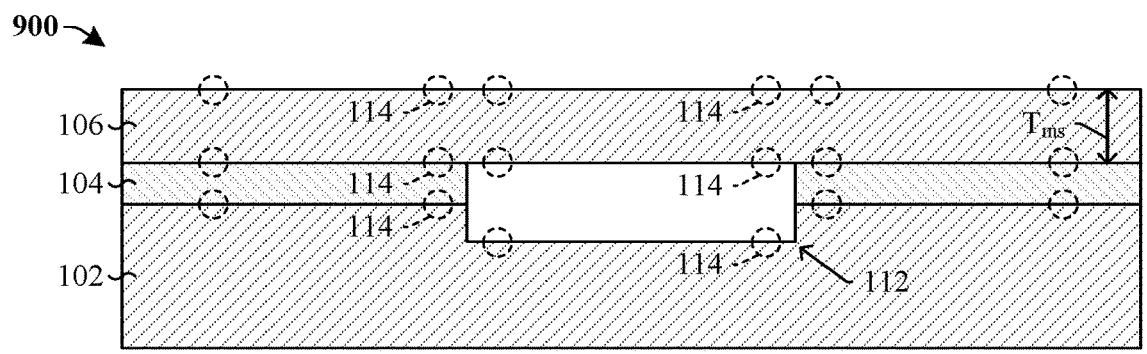

As shown in cross-sectional view 900 of FIG. 9, a thinning process is performed to reduce a thickness of the MEMS substrate 106. In some embodiments, the thinning process may, for example, include an etching process, a grinding process, or another removal process. The thinning process reduces the thickness $T_{ms}$ of the MEMS substrate 106 to a range of approximately 5 to 775 micrometers. In some embodiments, after performing the thinning process, a plurality of alignment marks 114 are formed on a top surface of the MEMS substrate 106.

Figure 10:
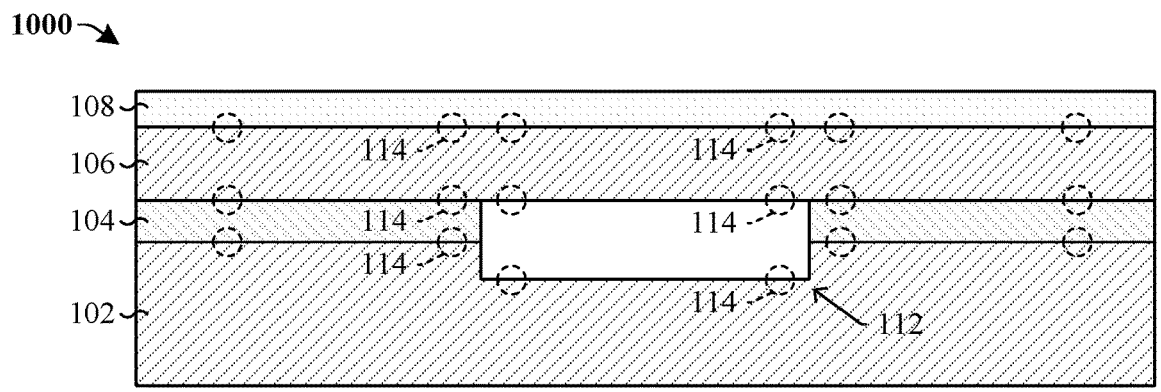

As shown in cross-sectional view 1000 of FIG. 10, an epitaxial layer 108 is formed over the MEMS substrate 106. The epitaxial layer 108 may, for example, be formed by molecular beam epitaxy (MBE), vapor phase epitaxy (VPE), liquid phase epitaxy (LPE), some other suitable epitaxial process, or any combination of the foregoing. Further, while performing the epitaxy of the epitaxial layer 108 doping is simultaneously performed. In some embodiments, the epitaxial layer 108 may, for example, be or comprise polysilicon, silicon, amorphous silicon, or the like formed to a thickness within a range of approximately 1 to 1000 nanometers. In some embodiments, a doping concentration of the epitaxial layer 108 is within a range of approximately $1*10^{17}$ to $1*10^{20}$ atoms/cm$^3$. In some embodiments, the epitaxial layer 108 has a resistance within a range of approximately 1 to 5 milliohm-cm.

Figure 11A:
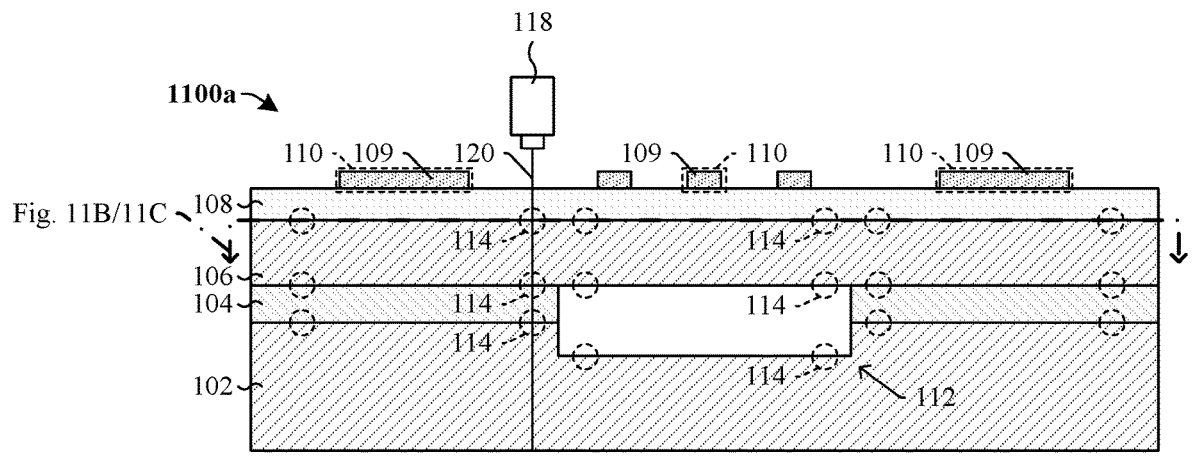

As shown in cross-sectional view 1100a of FIG. 11A, a plurality of contacts 110 are formed over the epitaxial layer 108. The IR sensor 118 is used during formation of the plurality of contacts 110 to align the plurality of contacts by virtue of at least the plurality of alignment marks 114 on the top surface of the carrier substrate 102. The IR sensor 118 illuminates the IR light 120 from a top surface of the epitaxial layer 108 to the plurality of alignment marks 114 on the top surface of the carrier substrate 102. The plurality of contacts 110 are comprised of a metal layer 109. In some embodiments, the metal layer 109 may, for example, be or comprise aluminum, copper, aluminum copper, or the like formed to a thickness within a range of approximately 100 to 3000 nanometers. The plurality of contacts 110 respectively form an ohmic contact with the epitaxial layer 108.

In some embodiments, the plurality of contacts 110 are formed, for example, by forming a metal sheet comprising openings over the epitaxial layer 108 (not shown). During formation of the metal sheet, the IR sensor 118 illuminates the IR light 120 through the openings and aligns the sheet by virtue of at least the plurality of alignments marks 114 on the top surface of the carrier substrate 102. After forming the metal sheet over the epitaxial layer 108, an etching process is performed on the metal sheet to define the metal layer 109 and subsequently the plurality of contacts 110. In some embodiments, the IR sensor 118 is utilized during the etching process to ensure the plurality of contacts 110 are aligned by virtue of the plurality of alignment marks 114.

In some embodiments, the plurality of contacts 110 are formed, for example, by a lift-off process (not shown). The lift-off process includes: forming a masking layer (e.g., photoresist) over the epitaxial layer 108, patterning the masking layer such that the masking layer comprises a plurality of openings, forming the metal layer 109 over the masking layer such that the metal layer 109 fills the plurality of openings, removal of the masking layer and any materials overlying the masking layer. The metal layer 109 that filled the plurality of openings is left as the plurality of contacts 110. In the aforementioned example, the plurality of alignment marks 114 and the IR sensor 118 are utilized during the patterning of the masking layer (not shown).

Figure 11B:
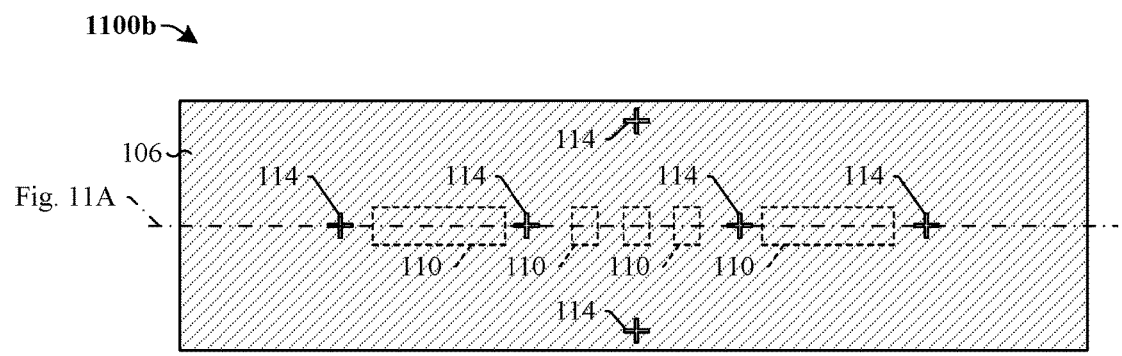

With reference to FIG. 11B, some embodiments of a top view 1100*b* of the MEMS substrate 106 of FIG. 11A, as indicated in the cut-away lines shown in FIGS. 11A and 11B is provided.

As shown in FIG. 11B, the plurality of alignment marks 114 are laterally offset from the plurality of contacts 110. It may be appreciated that the location of the plurality of alignment marks 114 may be located anywhere within the MEMS substrate 106 and/or carrier substrate 102 laterally offset from the plurality of contacts 110, thus FIG. 11B is merely an example. Additionally, it may be appreciated that the plurality of alignment marks 114 comprise a cross shape, however the plurality of alignment marks 114 may comprise any suitable shape, thus FIG. 11B is merely a non-limiting example. In some embodiments, the plurality of alignment marks 114 on the top surface of the carrier substrate 102 comprise a same shape as and directly underlie the plurality of alignment marks 114 on the top surface of the MEMS substrate 106. The location of the plurality of alignment marks 114 in FIG. 11B may, for example, be used during the formation of the plurality of contacts 110 that includes forming the metal sheet comprising openings over the epitaxial layer 108.

Figure 11C:
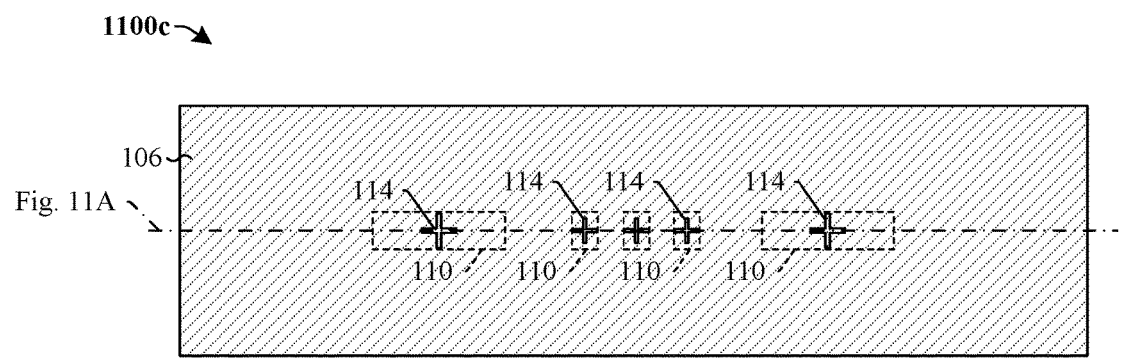

With reference to FIG. 11C, some embodiments of a top view 1100*c* of the MEMS substrate 106 of FIG. 11A, as indicated in the cut-away lines shown in FIGS. 11A and 11C is provided.

As shown in FIG. 11C, the plurality of alignment marks 114 are laterally within outer sidewalls of the plurality of contacts 110. The plurality of alignment marks 114 on the top surface of the carrier substrate 102 comprise a same shape as and directly underlie the plurality of alignment marks 114 on the top surface of the MEMS substrate 106. The location of the plurality of alignment marks 114 in FIG. 11C may, for example, be used during the formation of the plurality of contacts 110 that includes performing a lift-off process.

Figure 12A:
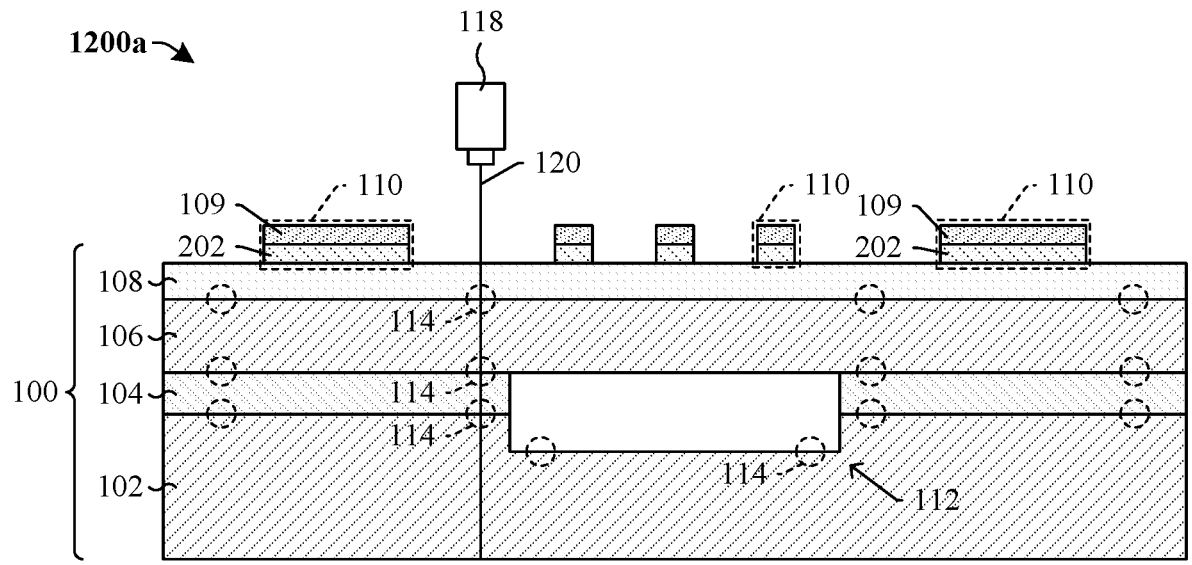

As shown in cross-sectional view 1200*a* of FIG. 12A, an alternative embodiment for forming the plurality of contacts 110 over the epitaxial layer 108 is provided. A process for forming the plurality of contacts 110 illustrated in FIG. 12A includes: forming a silicon layer and a sacrificial metal layer over the epitaxial layer 108, patterning the silicon layer and the sacrificial metal layer defining the metal layer 109, and performing an annealing process to form the silicide layer 202. In some embodiments, the IR sensor 118 is utilized during the formation and patterning steps of the silicon layer and sacrificial metal layer to ensure the plurality of contacts 110 are aligned by virtue of the plurality of alignment marks 114.

Figure 12B:
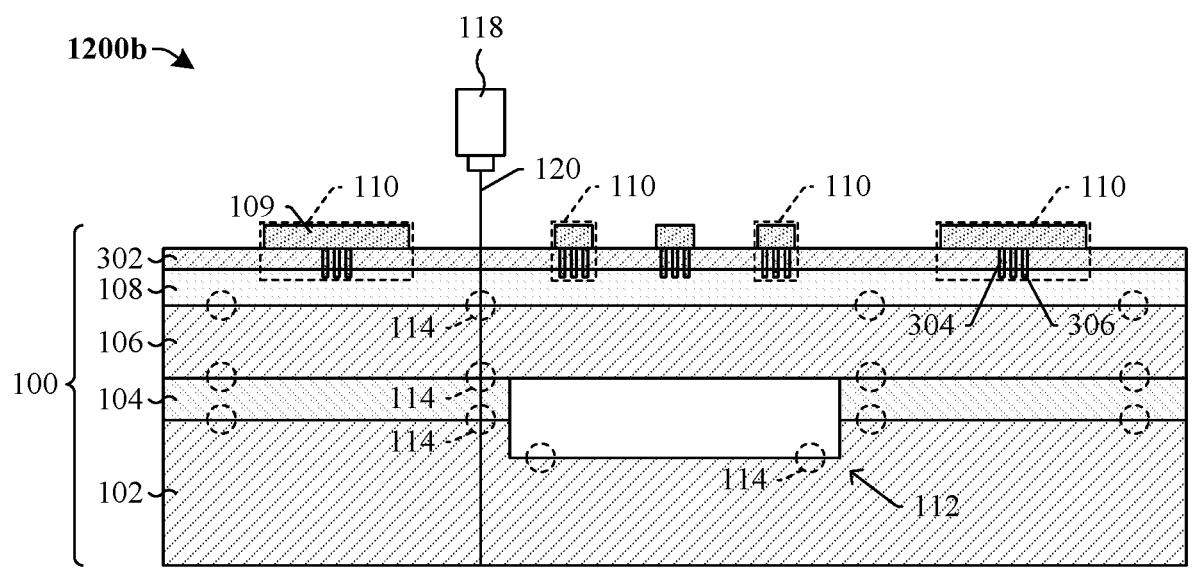

As shown in cross-sectional view 1200*b* of FIG. 12B, an alternative embodiment for forming the plurality of contacts over the epitaxial layer 108 is provided. A process for forming the plurality of contacts 110 illustrated in FIG. 12B includes: forming a passivation layer 302 over the epitaxial layer 108, patterning the passivation layer 302 and forming a plurality of vias 304 through the passivation layer 302, performing an annealing process to form a plurality of silicide segments 306 directly beneath the plurality of vias 304, and forming a metal layer 109 directly above the plurality of vias 304 to define the plurality of contacts 110. In some embodiments, the IR sensor 118 is utilized during the patterning of the passivation layer, formation of the plurality of vias 304, and the formation of the metal layer 109 to ensure the plurality of contacts 110 are aligned by virtue of the plurality of alignment marks 114.

Figure 13:
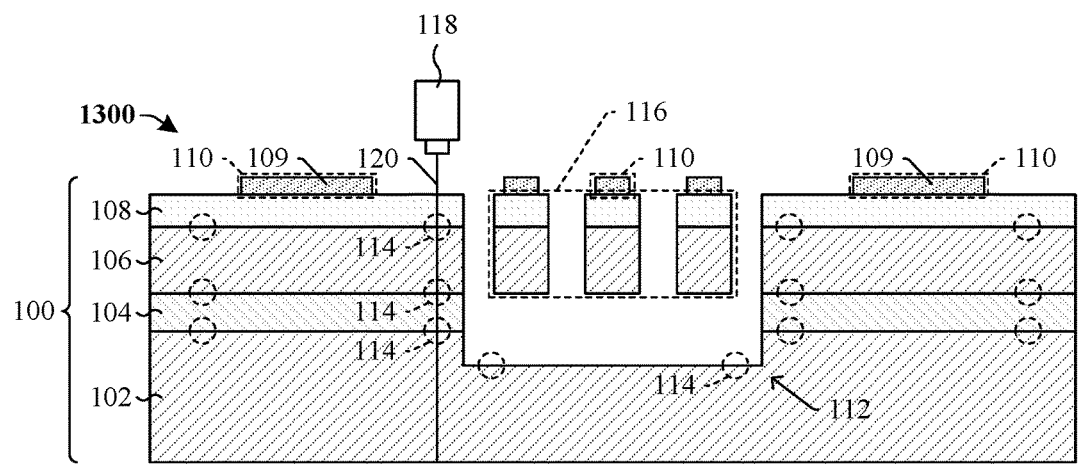

As shown in cross-sectional view 1300 of FIG. 13, an etching process is performed into the MEMS substrate 106 and the epitaxial layer 108 of FIG. 11A defining a MEMS structure 100. The etching process unseals the cavity 112 of FIG. 11A, thus defining the cavity 112 from the top surface of the carrier substrate 102 to the top surface of the epitaxial layer 108. The etching process defines a plurality of moveable elements 116 within the cavity 112 such that a portion of the plurality of contacts 110 overlie the plurality of moveable elements 116. In some embodiments, the etching process utilizes the IR sensor 118 to ensure the plurality of moveable elements 116 are formed and aligned by virtue of the plurality of alignments marks 114.

Figure 14:
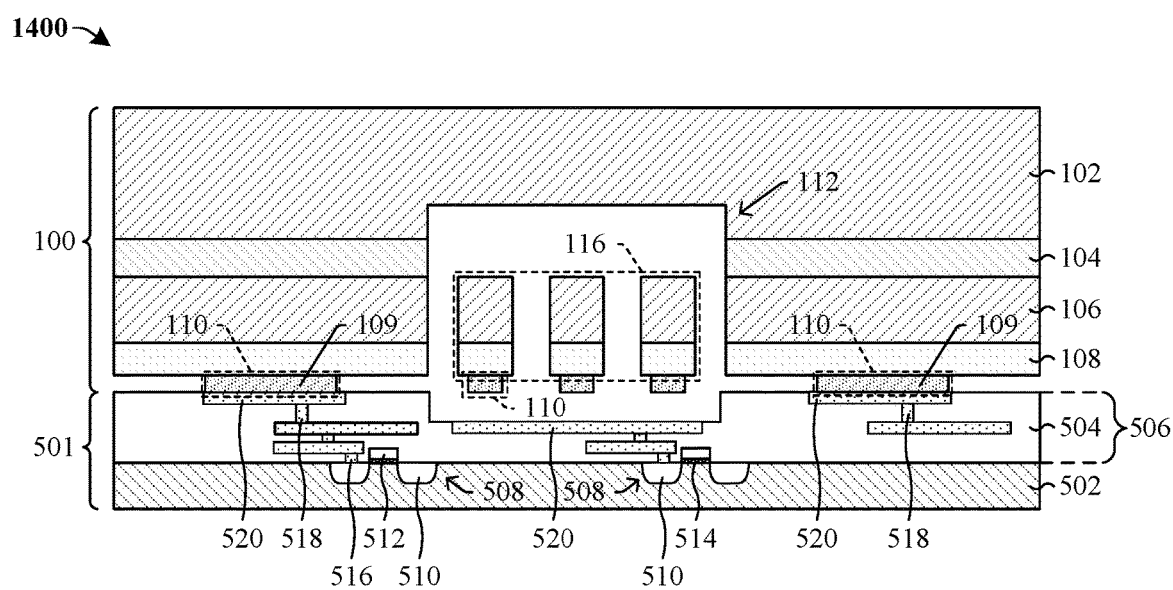

As shown in cross-sectional view 1400 of FIG. 14, the MEMS structure 100 of FIG. 13 is rotated 180 degrees and bonded to a complementary metal-oxide-semiconductor (CMOS) integrated circuit (IC) die 501. At least a portion of the plurality of contacts 110 are electrically coupled to electronic components on the CMOS IC die 501 such as transistors 508 through a BEOL metallization stack 506 by directly contacting metallization wires 520.

Figure 15:
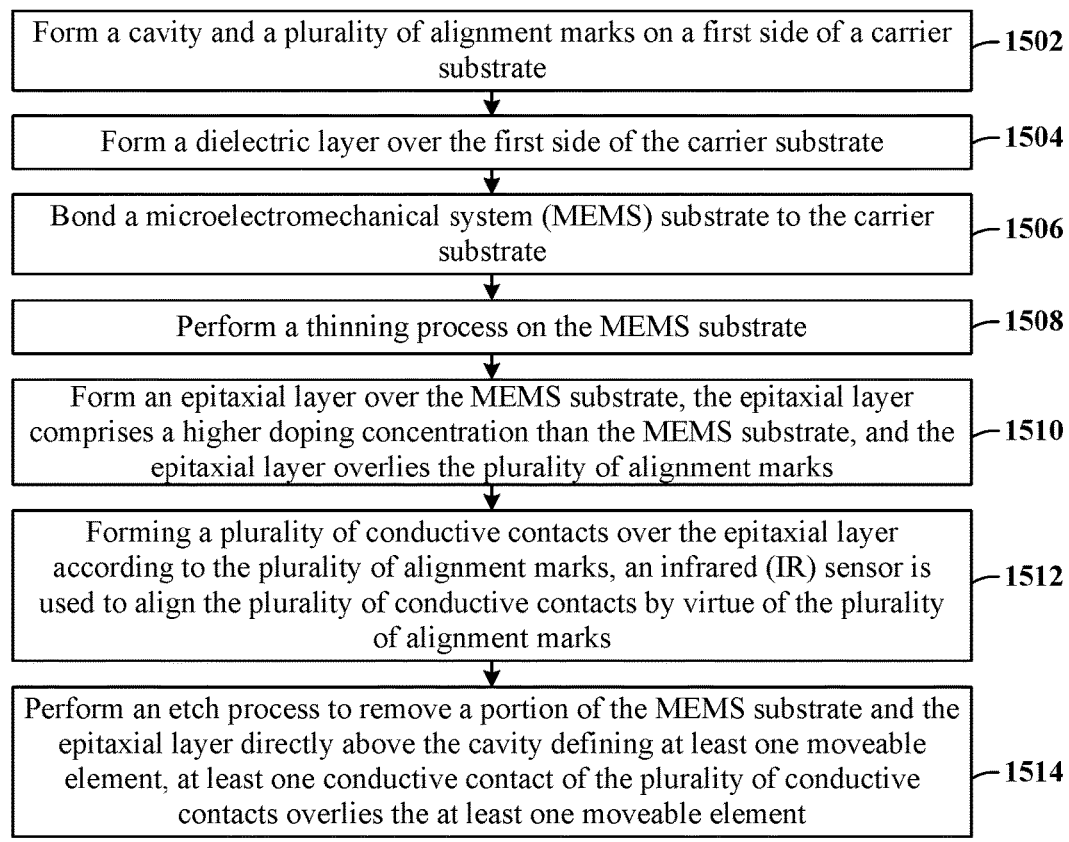
FIG. 15 illustrates a methodology in flowchart format that illustrates some embodiments of a method of forming an integrated chip.

FIG. 15 illustrates a method 1500 of forming an integrated chip in accordance with some embodiments. Although the method 1500 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1502, a cavity and a plurality of alignment marks are formed on a first side of a carrier substrate. FIG. 8 illustrates a cross-sectional view 800 corresponding to some embodiments of act 1502.

At 1504, a dielectric layer is formed over the first side of the carrier substrate. FIG. 8 illustrates a cross-sectional view 800 corresponding to some embodiments of act 1504.

At 1506, a microelectromechanical system (MEMS) substrate is bonded to the carrier substrate through the dielectric layer. FIG. 8 illustrates a cross-sectional view 800 corresponding to some embodiments of act 1506.

At 1508, a thinning process is performed on the MEMS substrate. FIG. 9 illustrates a cross-sectional view 900 corresponding to some embodiments of act 1508.

At 1510, an epitaxial layer is formed over the MEMS substrate, the epitaxial layer comprises a higher doping concentration than the MEMS substrate, and the epitaxial layer overlies the plurality of alignment marks. FIG. 10 illustrates a cross-sectional view 1000 corresponding to some embodiments of act 1510.

At 1512, a plurality of conductive contacts are formed over the epitaxial layer according to the plurality of alignment marks. An infrared (IR) sensor is used to align the plurality of conductive contacts by virtue of the plurality of alignment marks. FIG. 11A illustrates a cross-sectional view 1100a corresponding to some embodiments of act 1512.

At 1514, an etching process is performed to remove a portion of the MEMS substrate and the epitaxial layer directly above the cavity defining at least one moveable element. At least one conductive contact of the plurality of conductive contacts overlies the at least one moveable element. FIG. 13 illustrates a cross-sectional view 1300 corresponding to some embodiments of act 1514.

Accordingly, in some embodiments, the present disclosure relates to a method of forming an integrated chip that includes forming a highly doped epitaxial layer over a lowly doped MEMS substrate. A plurality of ohmic contacts are formed over the epitaxial layer and are concurrently aligned with an IR sensor by virtue of a plurality of alignment marks that underlie the epitaxial layer.

In some embodiments, the present application provides a method for manufacturing a microelectromechanical systems (MEMS) structure, the method including: bonding a MEMS substrate to a carrier substrate, wherein the MEMS substrate comprises monocrystalline silicon; forming an epitaxial layer over the MEMS substrate, wherein the epitaxial layer has a higher doping concentration than the MEMS substrate; and forming a plurality of contacts over the epitaxial layer, wherein the plurality of contacts respectively from ohmic contacts with the epitaxial layer.

In some embodiments, the present application provides a method for manufacturing an integrated chip, the method including: forming a plurality of alignment regions over a first substrate; bonding the first substrate to a second substrate to form a cavity between the first substrate and the second substrate; performing a thinning process on the second substrate; forming an epitaxial layer over the second substrate, wherein the epitaxial layer has a higher doping concentration than the second substrate; forming a plurality of contacts over a top surface of the epitaxial layer, wherein the forming process includes aligning the plurality of contacts over the first substrate by virtue of the plurality of alignment regions by using near-infrared (NIR) light illuminated from the top surface of the epitaxial layer to the plurality of alignment regions; and performing an etching process to remove a portion of the second substrate and the epitaxial layer directly above the cavity and define at least one movable element, wherein a first subset of the plurality of contacts are directly over the at least one movable element.

In some embodiments, the present application provides a microelectromechanical systems (MEMS) structure including: a MEMS substrate with a movable element arranged over a carrier substrate; an epitaxial layer overlying the MEMS substrate, wherein the epitaxial layer has a higher doping concentration than the MEMS substrate; and a plurality of contacts overlying the epitaxial layer, wherein at least one of the plurality of contacts is directly over the movable element, wherein the plurality of contacts respectively have an ohmic contact with the epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a microelectromechanical systems (MEMS) structure, the method comprising:
   bonding a MEMS substrate to a carrier substrate, wherein the MEMS substrate comprises monocrystalline silicon;
   forming an epitaxial layer over the MEMS substrate, wherein the epitaxial layer has a higher doping concentration than the MEMS substrate; and
   forming a plurality of contacts over the epitaxial layer, wherein the plurality of contacts respectively from ohmic contacts with the epitaxial layer.

2. The method according to claim 1, further comprising:
   performing an etching process to define at least one moveable element in the MEMS substrate and a cavity between an upper surface of the carrier substrate and a top surface of the epitaxial layer, wherein the at least one moveable element is within the cavity, and wherein at least one contact from the plurality of contacts overlies the at least one moveable element.

3. The method according to claim 1, wherein formation of the plurality of contacts comprises:
   forming a silicon layer over the epitaxial layer;
   forming a metal layer over the silicon layer; and
   performing an annealing process to convert the silicon layer into a silicide layer, wherein an ohmic contact exists between the metal layer and the epitaxial layer through the silicide layer; and
   performing an etching process to define the plurality of contacts.

4. The method according to claim 3, further comprising:
   forming a sacrificial metal layer over the silicon layer before forming the metal layer;
   wherein the annealing process converts the silicon layer and the sacrificial metal layer into the silicide layer, wherein the sacrificial metal layer comprises a metal different from a metal the metal layer is comprised of.

5. The method according to claim 3, wherein a bottom surface of the silicide layer is vertically below a top surface of the epitaxial layer and a top surface of the silicide layer is vertically above the top surface of the epitaxial layer.

6. The method according to claim 1, wherein formation of the plurality of contacts comprises:
   forming a passivation layer over the epitaxial layer;
   forming a plurality of metal vias through the passivation layer, wherein the plurality of vias directly contact a top surface of the epitaxial layer;
   forming a metal layer over the passivation layer; and
   performing an etching process into the metal layer to define the plurality of contacts, wherein each metal via underlies a contact in the plurality of contacts.

7. The method according to claim 6, further comprising:
   performing an annealing process after forming the plurality of metal vias such that a silicide layer of a material the plurality of metal vias forms below the top surface of the epitaxial layer under each metal via.

8. The method according to claim 6, wherein the plurality of metal vias comprise a first material different than a second material the metal layer is comprised of.

9. The method according to claim 1, wherein the MEMS substrate comprises intrinsic monocrystalline silicon.

10. A method for manufacturing an integrated chip, the method comprising:
   forming a plurality of alignment regions over a first substrate;
   bonding the first substrate to a second substrate to form a cavity between the first substrate and the second substrate;
   performing a thinning process on the second substrate;
   forming an epitaxial layer over the second substrate, wherein the epitaxial layer has a higher doping concentration than the second substrate;
   forming a plurality of contacts over a top surface of the epitaxial layer, wherein the forming process includes aligning the plurality of contacts over the first substrate by virtue of the plurality of alignment regions by using near-infrared (NIR) light illuminated from the top surface of the epitaxial layer to the plurality of alignment regions; and
   performing an etching process to remove a portion of the second substrate and the epitaxial layer directly above the cavity and define at least one movable element, wherein a first subset of the plurality of contacts are directly over the at least one movable element.

11. The method according to claim 10, wherein a second subset of the plurality of contacts are arranged laterally outside the cavity, a minimum width of the plurality of contacts within the second subset is at least two times greater than a maximum width of the plurality of contacts within the first subset.

12. The method according to claim 10, wherein the NIR light is used to align a photomask that is used to perform the etching process by virtue of the plurality of alignment regions.

13. The method according to claim 10, wherein the plurality of contacts respectively form ohmic contacts with the epitaxial layer.

14. The method according to claim 10, wherein the NIR light is illuminated from above the top surface of the epitaxial layer to a bottom surface of the first substrate.

15. The method according to claim 10, wherein a second plurality of alignment regions are formed on the second substrate before forming the epitaxial layer, wherein any alignment by virtue of the plurality of alignment regions concurrently utilizes the second plurality of alignment regions.

16. The method according to claim 10, wherein at least one alignment region in the plurality of alignment regions is formed on a lower surface of the cavity.

17. A method for manufacturing an integrated chip, the method comprising:
   forming a plurality of alignment marks on a carrier substrate;
   bonding the carrier substrate to a microelectromechanical systems (MEMS) substrate to form a cavity between the carrier substrate and the MEMS substrate, wherein the bonding process includes aligning the MEMS substrate over the carrier substrate by virtue of the plurality of alignment marks by using infrared (IR) light;
   performing a thinning process on the MEMS substrate;
   forming an epitaxial layer over the MEMS substrate such that a resistance of the of the epitaxial layer is less than a resistance of the MEMS substrate;
   forming a plurality of contacts over a top surface of the epitaxial layer, wherein forming the plurality of contacts includes aligning the plurality of contacts over the carrier substrate by virtue of the plurality of alignment marks by using IR light illuminated from the top surface of the epitaxial layer to the plurality of alignment marks;
   performing an etching process to remove a portion of the MEMS substrate and the epitaxial layer above the cavity and form at least one movable element, wherein a first subset of the plurality of contacts are directly over the at least one movable element; and
   bonding the plurality of contacts to an interconnect structure of an integrated circuit (IC) die.

18. The method of claim 17, wherein the resistance of the epitaxial layer is within a range of about 1 to 5 milliohms centimeter.

19. The method of claim 17, wherein bonding the carrier substrate to the MEMS substrate includes performing a fusion bond.

20. The method of claim 17, wherein the plurality of alignment marks are laterally offset from the plurality of contacts by one or more non-zero distances.

* * * * *